United States Patent
Stovall et al.

(10) Patent No.: US 7,209,055 B1
(45) Date of Patent: Apr. 24, 2007

(54) ELECTROSTATIC PARTICLE BEAM DEFLECTOR

(75) Inventors: Scott C. Stovall, San Jose, CA (US); Richard L. Lozes, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/242,976

(22) Filed: Oct. 3, 2005

(51) Int. Cl.
*H03M 1/22* (2006.01)

(52) U.S. Cl. .................................. 341/14; 341/144
(58) Field of Classification Search ........ 341/144–154, 341/110, 13, 14, 140; 250/492.23, 492.22, 250/492.2
See application file for complete search history.

(56) References Cited

U.S. PATENT DOCUMENTS

| | | | |
|---|---|---|---|
| 3,894,271 A | | 7/1975 | Pfeiffer et al. |
| 4,243,866 A | | 1/1981 | Pfeiffer et al. |
| 5,051,556 A | * | 9/1991 | Sakamoto et al. ..... 219/121.25 |
| 5,546,319 A | * | 8/1996 | Satoh et al. ................... 716/21 |
| 5,614,725 A | * | 3/1997 | Oae et al. .............. 250/492.22 |
| 5,876,902 A | | 3/1999 | Veneklasen et al. |
| 6,259,106 B1 | | 7/2001 | Boegli et al. |
| 6,262,429 B1 | * | 7/2001 | Rishton et al. ......... 250/492.23 |
| 6,781,537 B1 | * | 8/2004 | Taraschuk et al. ........... 341/144 |
| 6,833,913 B1 | * | 12/2004 | Wolf et al. ............... 356/237.2 |

OTHER PUBLICATIONS

Takemura et al.; "ADvanecd E-Beam Lithography System.. " 19th Annual BACUS Symposium on Photomask Technology, Monterey California Sep. 1999 SPIE vol. 3873 277-786X/99/$10.
Dick et al.; "Parallel and Hierarchical postprocessing.. " J. Vac. Sci. Technol. B 16(6), Nov./Dec. 1998.
Nakagawa et al.; "Development of a Next Generation.. " JEOL Ltd. Semiconductor Equipment Division 1-2-3Chome, Musashino, Akishima, Tonyo 196-8558, Japan, Sep. 1998.

* cited by examiner

*Primary Examiner*—Linh V. Nguyen
(74) *Attorney, Agent, or Firm*—Janah & Associates, P.C.

(57) ABSTRACT

An electrostatic deflector for a particle beam apparatus comprises opposing deflector plates that face one another across a particle beam gap and are electrostatically chargeable. Each deflector plate comprises its own voltage driver, which has a DAC and amplifier. Digital electronics receives an input digital code that expresses the complementary voltages to be applied to opposing deflector plates. When the input digital code is determined to provide a non-linear output response voltage from a DAC, the digital electronics provides an output digital code with a different digital code that provides a linear response from the DAC while providing the same differential voltage between the first and second deflector plates.

24 Claims, 7 Drawing Sheets

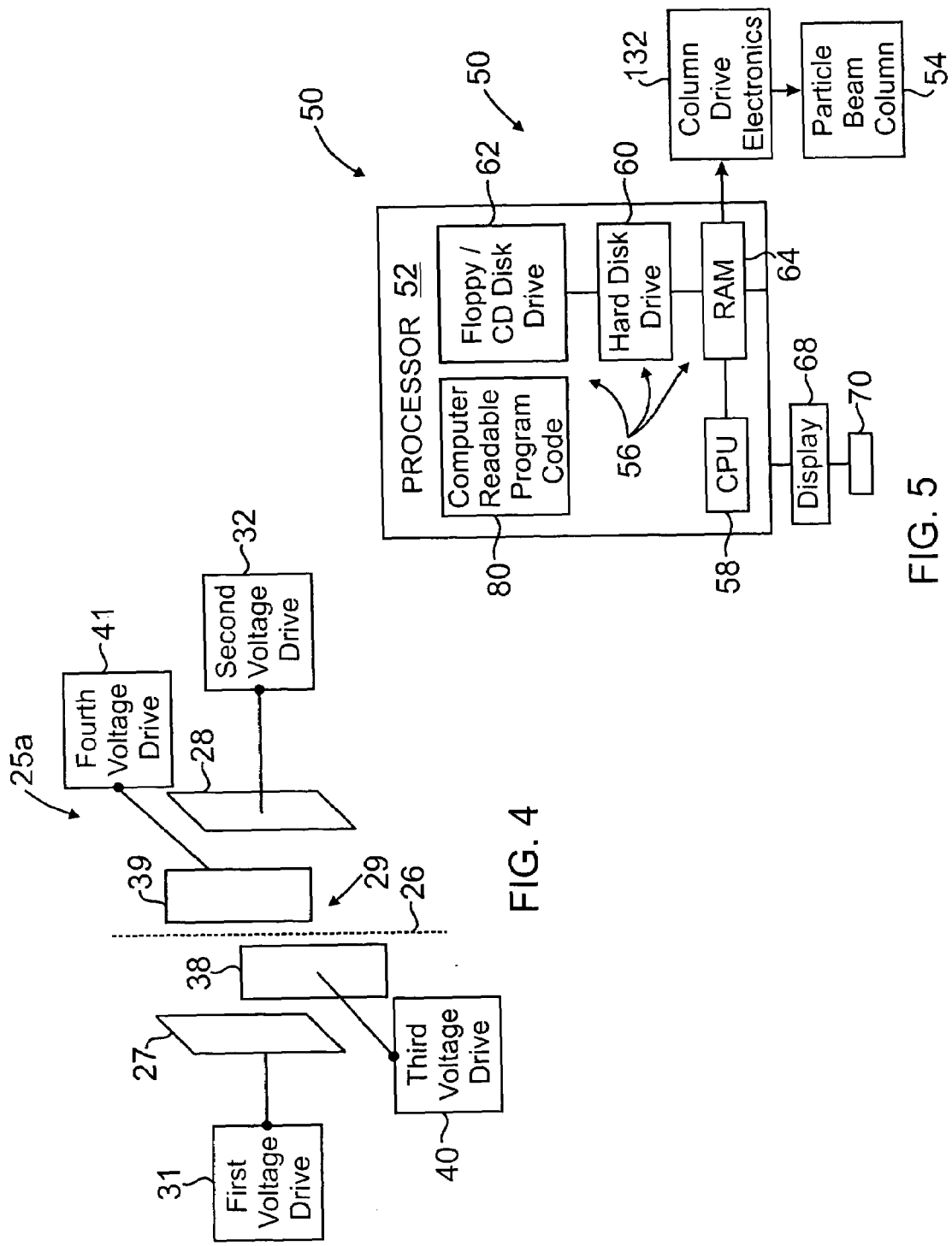

ELECTROSTATIC PARTICLE BEAM DEFLECTOR

BACKGROUND

Embodiments of the present invention relate to deflection of a shaped particle beam while writing a circuit design pattern on a substrate.

Pattern generators are used to write patterns on substrates, such as masks for semiconductor fabrication, semiconductor wafers, displays and circuit boards, magnetic bubble fabrication, and optical data storage media fabrication. Patterned lithographic masks are used to transfer a circuit design pattern into a substrate, such as a semiconductor wafer or dielectric to fabricate integrated circuits, printed circuits (PCB), displays, and other patterned boards. A typical process for fabricating a lithographic mask includes, for example, (i) forming a layer of a metal-containing material on a radiation permeable plate, (ii) forming a resist layer on the metal-containing layer to create a blank lithographic mask, the resist layer being sensitive to a particle beam such as an electron or ion beam, (iii) writing a pattern on the mask by selectively exposing the blank lithographic mask to the modulated particle beam, (iv) developing the exposed material to reveal a pattern of features, (v) etching the revealed portions of the metal-containing material between the resist features to transfer the pattern captured in the resist features into the metal-containing material, and (vi) stripping residual resist from the lithographic mask.

The pattern is written by selectively exposing an energy sensitive resist layer on the substrate to a modulated particle beam. The particle beam, which can be an electron or ion beam, is formed in a beam column having discrete components that focus, blank and deflect the electrons or ions to write a pattern on a substrate. Conventional electron beam columns provide an electron beam which is flashed while a substrate is moved, as for example described in U.S. Pat. No. 6,262,429 to Rishton et al.; U.S. Pat. No. 5,876,902 to Veneklasen et al.; U.S. Pat. No. 3,900,737 to Collier et al.; and U.S. Pat. No. 4,243,866 to Pfeiffer et al.; all of which are incorporated herein by reference in their entireties. The electron beam column has electrostatic deflectors and beam shaping aperture plates. The deflectors deflect the electron beam across the aperture plates to control the shape of an electron beam flash in the writing process.

Conventional deflectors often do not provide sufficiently high beam deflecting accuracies to write circuit design patterns having features with dimensions on the order of less than 50 nm—this feature size is more than 2½ times smaller than conventional feature sizes of over 130 nm. A highly accurate deflector is also needed to provide accurate beam deflection when writing patterns in multiple successive layers that need to be overlaid upon one another with good accuracy. A schematic diagram of a conventional deflector 10 having a single voltage drive 12 that provides complementary voltages to two parallel facing deflector plates 14, 16 shown in FIG. 1. The voltage drive 12 comprises a digital to analog converter (DAC) 18 which converts an input digital code to an analog voltage, which is then passed to an amplifier 20 which amplifies the analog voltage and passes complementary positive and negative voltages to the deflector plates 14, 16. The voltage between the deflector plates deflects the particle beam 22 by an amount proportional to magnitude of the voltage. However, such conventional deflectors have limited beam deflection accuracy. For example, the DAC of the deflector often provides a non-linear voltage response to an input digital signal which contributes to deflection inaccuracy. Typically, the nonlinear response occurs at the segment boundaries of the digital code. Custom integrated circuit DACs can also be used to avoid such non-linearities, however, such DACs are quite expensive and often have slow processing speeds Thus, it is desirable to have a deflector capable of accurately controlling particle beam deflection to provide high resolution patterning. It is desirable to have a deflector that can write a pattern onto a substrate with adequate resolution without sacrificing process throughput.

SUMMARY

An electrostatic deflector for a particle beam apparatus comprises first and second deflector plates that face one another across a particle beam gap, the deflector plates being electrostatically chargeable. A first voltage driver provides a first voltage to the first deflector plate, the first voltage driver comprising a first DAC to convert a first digital code to a first analog voltage signal which is passed to a first amplifier to generate a first voltage to be applied to the first deflector plate. A second voltage driver provides a second voltage to the second plate that is complementary to the first voltage, the second voltage driver comprising a second DAC to convert a second digital code to a second analog voltage signal which is passed to a second amplifier to generate a second voltage to be applied to the second deflector plate.

Another version of the deflector comprises a first voltage driver comprising a first DAC to convert a first digital code to a first analog voltage signal, and a first amplifier to amplify the first output analog voltage signal to generate a first voltage to be applied to the first deflector plate, and a second voltage driver comprises a second DAC to convert a second digital code to a second analog voltage signal, and a second amplifier to amplify the second analog voltage signal to generate a second voltage to be applied to the second deflector plate, the second voltage being substantially complementary to the first voltage to maintain a selected differential voltage between the first and second deflector plates. Digital electronics receive an input digital code that expresses the first and second voltages to be applied to opposing the first and second deflector plates, and substitute the input digital code with an output digital code such that (i) when the input digital code is determined to provide a linear output response voltage from the first or second DAC, the output digital code is maintained the same as the input digital code, and (ii) when the input digital code is determined to provide a non-linear output response voltage from the first or second DAC, the output digital code is substituted with a different digital code that provides a linear response from the first or second DAC while providing the same differential voltage between the first and second deflector plates.

Still another version of the deflector comprises digital electronics to (i) receive an input digital code that expresses the first and second voltages to be applied to the first and second deflector plates, (ii) determine if the input digital code is listed in a lookup table and associated with a substitute input digital code which bypasses any non-linear output response voltage of the first or second DAC, (iii) generate an output digital code which is either the input digital code or the substitute digital code, (iv) look up a translation table that associates each output digital code with a first bit code for the first DAC and a second bit code for the second DAC, and (v) pass the first bit code to the first DAC and the second bit code to the second DAC.

A cascaded electrostatic deflector for a particle beam apparatus comprises an upper deflector comprising a pair of opposing upper deflector plates that are electrostatically chargeable and face one another across a particle beam gap; a first upper voltage driver comprising a first DAC to convert a first digital code to a first analog voltage signal, and a first amplifier to amplify the first output analog voltage signal to generate a first voltage to be applied to the one of the deflector plates; and a second upper voltage driver comprising a second DAC to convert a second digital code to a second analog voltage signal, and a second amplifier to amplify the second analog voltage signal to generate a second voltage to be applied to the other deflector plate, the second voltage being substantially complementary to the first voltage to maintain a selected differential voltage between the deflector plates. A lower deflector comprises a pair of opposing lower deflector plates that are electrostatically chargeable and face one another across a particle beam gap; a first lower voltage driver comprising a first DAC to convert a first digital code to a first analog voltage signal, and a first amplifier to amplify the first output analog voltage signal to generate a first voltage to be applied to a lower deflector plate; and a second lower voltage driver comprising a second DAC to convert a second digital code to a second analog voltage signal, and a second amplifier to amplify the second analog voltage signal to generate a second voltage to be applied to the other lower deflector plate, the second voltage being substantially complementary to the first voltage to maintain a selected differential voltage between the opposing deflector plates. Digital electronics to receive an input digital code that expresses the voltages to be applied to each upper and lower deflector plate, and substitute the input digital code with an output digital code such that (i) when the input digital code is determined to provide a linear output response voltage from a DAC, the output digital code is maintained the same as the input digital code; and (ii) when the input digital code is determined to provide a non-linear output response voltage from the DAC, the output digital code is substituted with a different digital code that provides a linear response from the DAC while providing the same differential voltage between a pair of opposing upper or lower deflector plates.

Yet another version comprises a multifunction deflector system comprising a plurality of sets of cascaded deflectors, the multifunction deflector system comprising:

(a) a first cascaded deflector set comprising first and second deflectors that are stacked one below the other, the first and second deflectors comprising pairs of opposing deflector plates that are each powered by a separate voltage driver comprising a DAC;

(b) a second cascaded deflector set comprising third and fourth deflectors that are stacked one below the other; the third and fourth deflectors comprising pairs of opposing deflector plates that are each powered by a separate voltage driver comprising a DAC; and (c) digital electronics to receive an input digital code that expresses the voltages to be applied to each of the deflector plates, and substitute the input digital code with an output digital code such that:

(i) when the input digital code is determined to provide a linear output response voltage from a DAC of a voltage driver, the output digital code is maintained the same as the input digital code, and (ii) when the input digital code is determined to provide a non-linear output response voltage from the upper or lower DAC, the output digital code is substituted with a different digital code that provides a linear response from a DAC of the voltage driver while providing the same differential voltage between a pair of opposing deflector plates.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 4 is a schematic diagram of a deflector comprising two pairs of deflector plates that are orthogonal to one another;

FIG. 5 is a schematic block diagram of a processor capable of processing a circuit design pattern to generate flash data for a particle beam column;

DESCRIPTION

Figure 1:
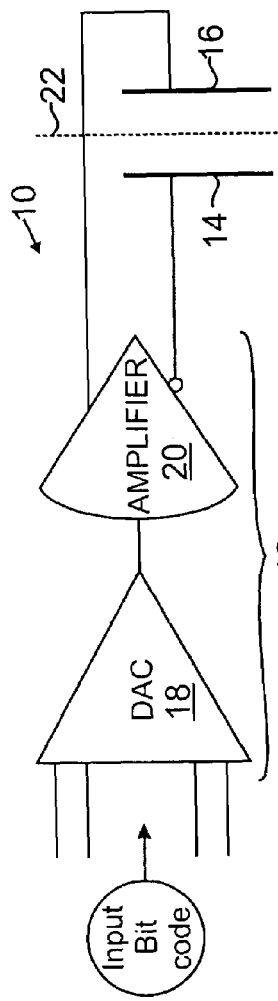
FIG. 1 (Prior Art) is a schematic diagram of a conventional particle beam deflector showing a single voltage drive that provides complementary voltages to two parallel deflector plates.
Figure 2:
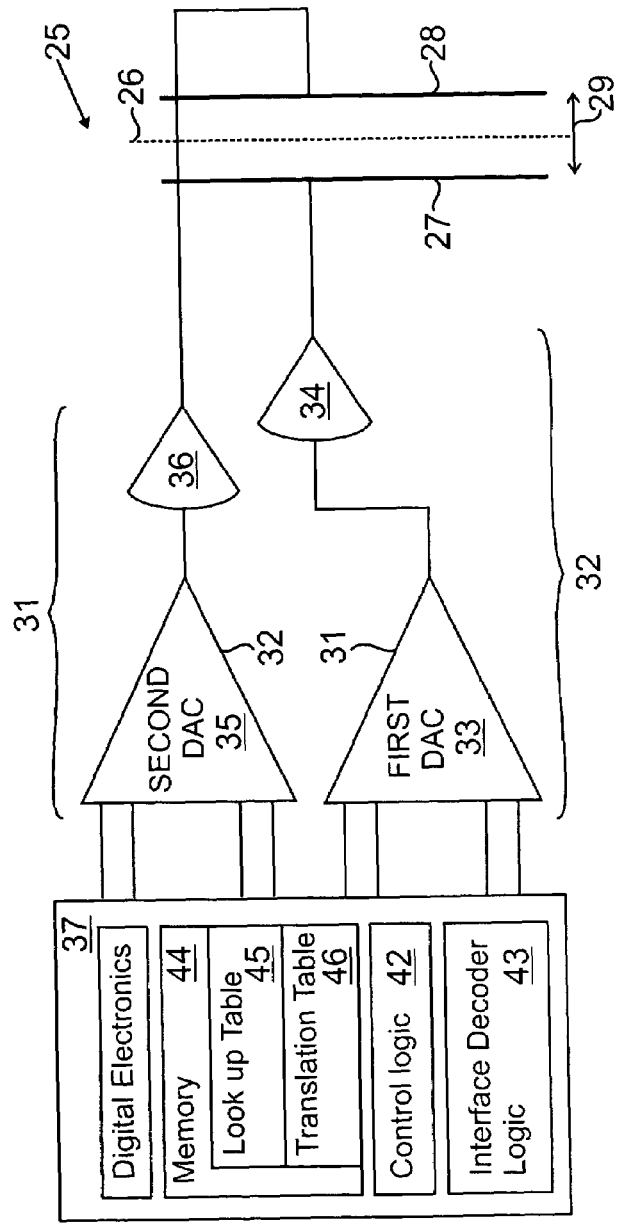
FIG. 2 is a schematic diagram of a particle beam deflector having separate voltage drives powering each deflector plate.

An exemplary embodiment of an electrostatic deflector 25 capable of providing more accurate deflection of a particle beam 26 is schematically illustrated in FIG. 2. Generally, the deflector 25 comprises at least first and second deflector plates 27, 28 that face one another across a particle beam gap 29. The deflector 25 is useful for deflecting the particle beam 26 by applying an electrostatic field across the beam 29. The particle beam 26 traverses through the particle beam gap 29, and can be for example, an electron beam, ion beam or other charged particle beam. The deflector plates 27, 28 are typically metal plates, for example copper plates, which are electrostatically chargeable to provide a voltage bias across the particle beam gap 29. When complementary voltages are applied to the deflector plates 27, 28, the electrostatic deflector 25 generates a controllable electrostatic field that can be used to deflect the particle beam 26 to, for example, produce different beam spot shapes, sizes, dimensions, positions, or other characteristics. The particle beam 26 operated on by the deflector 25 can be produced by a particle beam column, for example, an electron beam column or an ion beam column. When the deflector 25 is used in an electron beam column, the deflector in conjunction with apertures in the column are used to shape and modulate an electron beam to create electron flash fields having specified shapes, sizes and doses, which are useful in raster, vector, or shaped beam microvector scanning of the electron beam across a substrate.

In the version shown, the electrostatic deflector 25 comprises separate voltage drives to power each deflector plate 27, 28, including for example, a first voltage drive 31 to provide a first voltage to the first deflector plate 27 and a second voltage drive 32 to provide a second voltage to the second deflector plate 29. The second voltage is complementary to the first voltage, that is, the second voltage applied to the second deflector plate 28 operates in cooperation with the first voltage applied to the first deflector plate 27 to create a voltage difference of differential voltage between the two plates that produces a deflecting electric field between the plates. Typically, the first voltage driver 31 applies a first positive voltage to the first deflector plate 27, and the second voltage driver 32 applies a negative voltage to the second deflector plate 29, the magnitude of the negative voltage being substantially equal to the magnitude of the positive voltage.

In one version, the first voltage drive 31 comprises a first digital-to-analog converter DAC 33 capable of converting an input digital code comprising a first bit code into a first analog voltage signal. The DAC converts a digital code comprising a bit code sequence to an analog voltage signal. The DAC typically comprises a circuit of switches, a network of resistors, current sources and capacitors. In an exemplary embodiment, the first DAC 33 comprises a hybrid type DAC which use a combination of conversion techniques in a single converter. Advantageously, the hybrid DAC integrated circuit combines benefits of low cost, high speed and high precision in one device. The first DAC 33 decodes the upper 4 or 5 bits into 16 or 32 coarse segments. The remaining bits are fed into an R2R ladder which is a binary weighted DAC that creates each value with a repeating structure of 2 resistor values, R and R times two. The R2R ladder improves DAC precision due to the ease of producing many equal matched values of resistors or current sources, but lowers conversion speed due to parasitic capacitance. The "coarse current" from the segment decoder is summed with the "fine current" from the R2R ladder to generate the desired output current. The current output DAC provides good speed. The first DAC 33 is monotonic within a segment, however, at segment boundaries, relatively large discontinuities (4–8 LSBs) were determined. These segment boundary conditions are mitigated as explained below.

In one embodiment, the first DAC 33 has a resolution of at least 8 bits, more preferably at least 12 bits, and most preferably at least 14 bits. The resolution is determined by the number of possible output levels that the DAC is designed to reproduce. The resolution is usually stated as the number of bits used by the DAC, which is the base two logarithm of the number of levels. For instance a 1 bit DAC is designed to reproduce 2 ($2^1$) levels while an 8 bit DAC is designed for 256 ($2^8$) levels. Resolution is related to the Effective Number of Bits (ENOB) which is a measurement of the actual resolution attained by the DAC.

The settling time of the first DAC 33 was determined to be more important for performance than the maximum sampling frequency. The maximum sampling frequency of a DAC is a measurement of the maximum speed at which the DAC circuitry can operate and still produce the correct output. It indicates how fast the digital section can be clocked before data becomes corrupted. Generally, as stated in the Shannon-Nyquist sampling theorem, a signal must be sampled at over twice the bandwidth of the desired signal. Thus, to reproduce signals having frequencies of up to 400 MHz as applicable in the present application, the first DAC 33 should be capable of operating at least about 2 GHz. However, it was determined that most DACs were incapable of achieving their maximum sampling frequency when measured and instead took a certain time to settle to its final output level. The settling time of the DAC is the time taken for the DAC to settle to its final output value within a single clock at the specified maximum sampling frequency of the device. In the present application, a fast settling time was determined to be desirable, and for the first DAC 33 the settling time is at most about 1 ns, and more preferably, at most about ½ ns.

The first analog voltage signal from the first DAC 33 is passed to a first amplifier 34 which amplifies the first analog voltage signal to generate a first voltage to be applied to the first deflector plate 27. In an exemplary embodiment, the first amplifier 34 comprises a conventional high speed, open loop, low voltage amplifier.

The second voltage driver 32 comprises a second DAC 35 to convert an input digital code to a second analog voltage signal which is passed to a second amplifier 36 to generate a second voltage to be applied to the second deflector plate 28. The second DAC and second amplifier are essentially the same as the first DAC 33 and first amplifier 34. It should also be noted that while two DACS 33,35 and two amplifiers 34,36 are described, alternative versions can include configurations without separate amplifiers.

The deflector 25 further comprises digital electronics 37 to process digital codes before passing the digital codes to the DACs for conversion into corresponding analog signals. The digital electronics 37 comprise hardware and/or software components, for example, the digital electronics can be entirely software code operating on a processor (as described below); integrated circuit components, such as a flash programmable gate array (FPGA); or combinations of software code and integrated circuit components. Preferably, the digital electronics 37 comprises a dedicated field programmable logic controller (FPGA) that includes control logic 42, interface decoder logic 43, and a small memory 44 to store tables, such as the lookup table 45 and translation table 46 as shown in FIG. 2. The FPGA is a customized digital circuit that performs the functions of machines based on logic gates. The logic gates are arrangements of electrically controlled switches. Each logic gate represents a function of boolean logic providing an output that is an electrical flow or voltage, and which in turn, can control other logic gates. The digital circuit includes lookup, translation, and other tables that can be easily reprogrammed without changing the wiring. The FPGA is typically programmed using ladder logic.

In operation, before an input digital code is passed to the first or second DACs 33, 35 for translation and conversion into corresponding output analog voltage signals, the digital electronics 37 receives the input digital code to correct or substitute the same to avoid any non-linear response in output analog voltage of the DACs 33, 35. The input digital code expresses the first and second voltages to be applied to the first and second deflector plates 27, 28, which will produce a particular differential voltage between the deflector plates that results in the desired deflection of the particle beam 26. The input digital code can comprise a bit code sequence that expresses both the first and second complementary voltages, or a first bit code which expresses the voltage to be applied to the first deflector plate 27, and a second bit code which expresses the voltage to be applied to the second deflector plate 28.

The digital electronics 37 is programmed to substitute the input digital code with an output digital code that bypasses any nonlinear response region of the DACs 33, 35. The digital electronics 37 evaluates the received input digital code to determine whether the input digital code will result in a non-linear output response voltage when applied to from the first or second DAC 33, 35, respectively. When a non-linear output response voltage will result, the digital electronics 37 substitutes the input digital code with a different digital code that has been determined to provide a linear response from the first or second DACs 33, 35 while providing the same differential voltage between the deflector plates 27, 28 that expressed by the original input digital code. However, when the input digital code is determined to provide a linear output response voltage from the first or second DAC, the output digital code is maintained the same as the input digital code.

Figure 3:
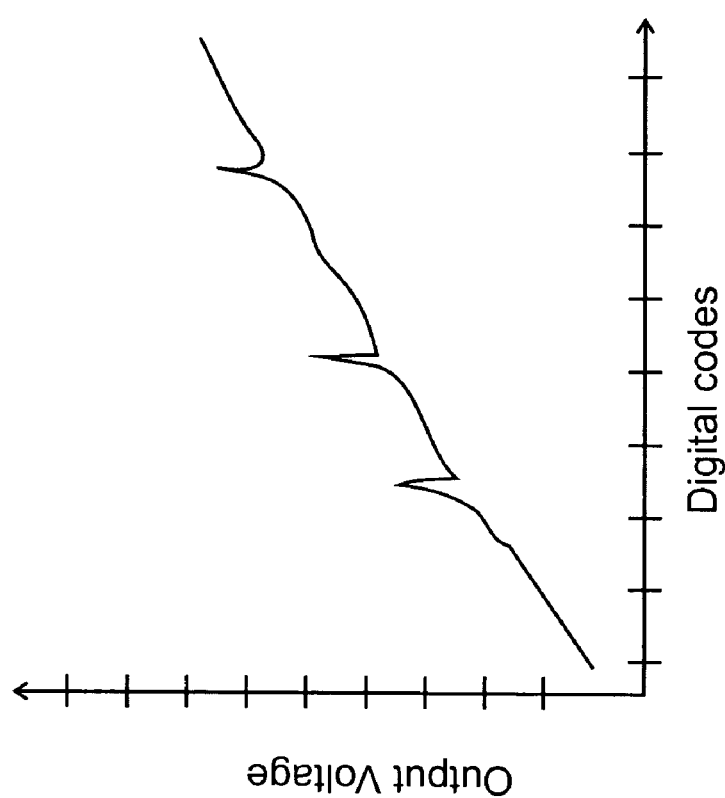
FIG. 3 is a graph of the output response voltage of a DAC for varying input digital codes showing spikes that reflect the nonlinear voltages occurring at segment boundaries of the digital codes applied to the DAC.

The substitute digital code is selected to avoid nonlinear response regions of the first or second DACs 33, 35. For example, a nonlinear response region can occur at a segment boundary of the digital codes applied to the DACs 33, 35. The segment boundaries are typically a function of the internal construction of a DAC. For example, extended precision DACs have two segments, one with high order bits and the other with low order bits. When the digital code applied to the DAC comprises low order bits that transition to all 1s or all 0s between those two states, the segment changes from full on to full off. That transition would be exactly compensated by the lowest order bit of the higher order transition but the transition is not always exact giving rise to non-linearity at segment boundaries. For example, FIG. 3 showing spikes that reflect the nonlinear voltages occurring at segment boundaries of digital codes applied to a DAC. When a digital code corresponding to a spike is applied to a DAC, the DAC generates an anomalous voltage that produces an undesired deflection in the deflector 25. This effect contributes to the deflection inaccuracies produced by the deflector 25. Consequently, removing those digital codes that produce nonlinear responses in the DACs significantly improve deflection accuracy of a deflector 25.

In one version, the digital electronics 37 receives the input digital code and looks up a stored lookup table 45 to determine if the input digital code is associated with a substitute digital code that is a different digital code in the table 45, as schematically illustrated in FIG. 2. The lookup table 45 contains substitute digital codes which bypass the non-linear response regions of the first or second DACs 33, 35 for particular input digital codes. The substitute digital code is a digital code that when applied to the first and second DACs 33, 35 will generate first and second voltages which still provide the same differential voltage between the deflector plates 27, 28, as that obtained from the original input digital code. At the same time, the substitute digital code avoids the nonlinear output voltage response regions of the first and second DACs 33, 35. This procedure detects and avoids particular input digital codes, for example, bit codes A, B, C, D, which are known to generate incorrect voltage outputs, due to DAC non-linearity. The look-up tables are used to drive the DACs 33, 35 in pairs, where (A,B) and (C,D) provide bit codes that provide correct or linear voltage responses.

In one version, the lookup table 45 contains a list of all input digital codes with "bad" input digital codes (the result and non-linear output voltage responses from the DACs) associated with substitute "good" digital codes that operate in linear response regions. In this version, the lookup table 45 contains only the bad input digital codes with associated substitute good codes. The digital electronics 37 operates faster with such a table because it only has to search through a short list of bad input codes to determine if a received input code is a bad one. However, the lookup table 45 can also contain all possible input digital codes with the good codes simply associated with the same digital code since these codes do not need to be changed.

The lookup table 45 is prepared from calibration table (not shown) comprising input digital codes associated with measured output voltage responses of a particular DAC. In one method, the calibration table is prepared by measuring the output voltage response of a DAC for a given input digital code fed to the DAC for a wide range of input digital codes. For example, different values of input digital codes set at increments of 1 bit can be passed to the DAC and the output voltage for each input digital code measured. The output voltage provided by the DAC for a particular input digital code are then associated with one another and stored in the calibration table. When the measured response of the DAC is nonlinear, that is, it is not a linear function of the input digital code, the non-linearity is recorded in this calibration table.

The lookup table 45 is then created from the calibration table. The lookup table 45 can contain, for example, only a list of "bad" input digital codes that resulted in a nonlinear output voltage from a particular DAC. Each bad input digital code is associated with an alternative good digital code that can be used instead of the bad digital code. The good primary digital code can be used to determine appropriate secondary bit codes for the first and second DACs 33, 35 that gives two discrete but complementary voltages with the same differential voltage when the two codes are supplied to each of the DACs.

While a lookup table 45 can be generated experimentally using a calibration procedure, the table can also be created by calculating for a particular DAC, the predicted output voltage response for a given input digital code. The calculated look up table 45 can use a mathematical function that expresses the output response voltages of a DAC for particular input digital codes. Instead of a look-up table, such a mathematical function can also be used to calculate, in real-time, substitute digital codes for bad digital codes to avoid nonlinear response regions of a DAC. For example, a suitable mathematical function is a piece-wise linear fit. As yet another example, a corrected substitute digital code can be calculated by, for example, adding or subtracting bits from the original bit code, where the number of bits that needs to be added or subtracted bits is determined experimentally or from theory.

After generating the corrected output digital code, the digital electronics 37 references a translation table 46 to convert the output digital code into a first bit code for the first DAC 33 and a second bit code for the second DAC 35. The first and second bit codes each comprise a sequence of bits that express the first and second voltages which are substantially complementary. Instead of the translation table 46, digital electronics 37 can also use a mathematical function to convert the output digital code into the first and second bit codes.

When the first and second DACs 33, 35 are operated in combination to supply complementary voltages to the first and second deflector plates 27, 28, the N-bit DACs can give (N+1) bits of resolution because the voltage difference between the plates has N+1 bits of resolution. The first and second voltage drives 31, 32 are each M-state drives, thereby giving a total of (2M−1) distinguishable deflector voltage states. These should be viewed as equivalence classes, as the M squared total states map onto the (2M−1) distinguishable states. This mapping redundancy can be exploited to avoid irregularities in the individual voltage drives 31, 32. The higher bit resolution of this deflector 25 allows avoiding non-linear output voltage responses that arise from the segment boundaries by picking most accurate state of each of the equivalence classes to use. This allows extending the useful range of N-bit DACs out to very nearly N bits.

Table I illustrates the bit code sequences produced by first DAC 33 (DAC A) and a second DAC 35 (DAC B) that are each capable of independently taking on 4 states. When used in conjunction, a deflector 25 comprising DAC A and DAC B has $4^2$=16 states, as shown in Table II. However, when used to deflect a particle beam, the deflection produced is given by the difference of the state of A and the state of B. There are only 2*4−1=7 independent difference states, as shown in Table III. Note that state 100 is absent and, for example, that there is more than one code combination that gives a difference of 001. The lookup table can be used to choose a code combination which yields the most accurate resulting voltage difference to minimize the non-linearity in output voltage response of a set of DACs for a particular input digital code.

TABLE I

| States of A or B |
|---|
| 00 |
| 01 |
| 10 |
| 11 |

TABLE II

| | A | | | |
|---|---|---|---|---|
| B | 00 | 01 | 10 | 11 |
| 00 | 0000 | 0100 | 1000 | 1100 |
| 01 | 0001 | 0101 | 1001 | 1101 |
| 10 | 0010 | 0110 | 1010 | 1110 |
| 11 | 0011 | 0111 | 1011 | 1111 |

TABLE III

| | A | | | |
|---|---|---|---|---|
| B | 00 | 01 | 10 | 11 |
| 00 | 000 | 001 | 010 | 011 |
| 01 | 111 | 000 | 001 | 010 |
| 10 | 110 | 111 | 000 | 001 |
| 11 | 101 | 110 | 111 | 000 |

A deflector 25 comprising a single pair of deflector plates 27, 28 is useful for applications in which the two deflector 27, 28 plates allow the deflection of the particle beam along a single axis at a time. These applications are inherently asymmetric, and include, for example, the deflection of a particle beam to provide a higher scan rate along a horizontal axis than the scan rate along a vertical axis. The difference in scan rates results in an inherently asymmetric deflection requirement which can be satisfied using a deflector having two opposing deflector plates which are aligned along the same axis.

However, for symmetric applications, in which it is desirable to deflect the particle beam equally along two different axes that represent a plane, for example, an X-axis and orthogonal Y-axis, the deflector 25a preferably comprises at least two orthogonal pairs of deflector plates. The exemplary embodiment of the deflector 25a as shown in FIG. 4 comprises a first pair of deflector plates comprising the first deflector plate 27 facing the second deflector plate 28, and a second pair of deflector plates comprising a third deflector plate 38 facing a fourth deflector plate 39. The deflector plates 27, 28, 38, and 39, are arranged along the boundary or circumference of a square or rectangular area surrounding a particle beam gap 29 through which a particle beam 26 is passed. The four deflector plates 27, 28, 38, and 39, form an orthogonal arrangement that allows deflection of the particle beam 26 in either the X-axis direction, the Y-axis direction, or both the X- and Y-axis directions to cover any position in the deflector plane 42. Each of the deflector plates 27, 28, 38, and 39, is separately powered by a voltage drive, so that the first deflector plate 27 is powered by a first voltage drive 31, the second deflector plate 28 is powered by the second voltage drive 32, the third deflector plate 38 is powered by a third voltage drive 40 and the fourth deflector plate 39 is powered by a fourth voltage drive 41.

A schematic of an exemplary embodiment of a particle beam apparatus 50 that uses the deflector 25 to shape and modulate a particle beam to provide flashes that are write a circuit design pattern onto a substrate, is shown in FIG. 5. The apparatus 50 can provide a shaped particle beam that is, for example, an electron or ion beam that can be shaped to provide different geometric flash shapes. The apparatus 50 comprises a processor 52 to process circuit pattern data and column drive electronics 132 to control a particle beam column 54. The particle beam column 54 can provide a single beam or a set of particle beams, which are organized to provide a brush of beams. An exemplary particle beam apparatus capable of performing this writing strategy that uses electron beams is described in, for example, commonly assigned U.S. patent application Ser. No. 11/249,239, entitled "CLEANING OF COMPONENTS HAVING MULTICOMPOSITIONAL PROCESS RESIDUES", to Brueckner et al., which is being filed on even date herewith, and which is incorporated herein by reference in its entirety.

A circuit design pattern to be written with the particle beam onto a substrate is generated and processed to form flashes that can be written onto a substrate as described in, for example, commonly assigned U.S. patent application Ser. no. 11/243,299, entitled "WRITING A CIRCUIT DESIGN PATTERN WITH SHAPED PARTICLE BEAM FLASHES, to Buller et al., which is being filed on even date herewith, and which is incorporated herein by reference in its entirety. To write the circuit design pattern onto a substrate, the processor 52 reads at least a portion of the circuit design pattern from the memory 56, the size of the read data dependent upon its buffer memory size, and processes the read data into flashes for writing. The processor 52 comprises electronic hardware and circuitry comprising integrated circuits suitable for processing data to send data signals to the column drive electronics 132, which in turn, have electronic components to operate the particle beam column 54 and its peripheral components. For example, the column drive electronics 132 can send signals to, and receive signals from, one or more deflectors 25 which are part of the particle beam column 54 to flash the beam in the selected order of flashes while moving a substrate upon which the beam is incident to write the pattern onto the substrate. While the processor 52 and column drive electronics 132 are described as separate units, they can also be combined into one unit, or broken into further units as would be apparent to one of ordinary skill in the art. Also, the aforementioned digital electronics 37 which processes the digital code to be applied to the deflector 25 can be part of either the processor 52, the column drive electronics 132, or a separate entity.

Generally, the processor 52 is adapted to receive and accept data, run algorithms, produce output data and signals, detect data signals from the detectors and other chamber components, and to monitor or control a particle beam apparatus. For example, the processor 52 may comprise a computer comprising (i) a central processing unit (CPU) 58, such as for example a conventional microprocessor from INTEL Corporation, (ii) a memory 56 that includes a non-removable storage medium 60, such as for example, a hard drive such as a RAID drive, ROM, RAM, and a removable storage medium 62, such as for example a CD or floppy drive; (iii) application specific integrated circuits (ASICs) that are designed and preprogrammed for particular tasks, such as retrieval of data, data processing, and operation of particular components of the particle beam apparatus; and (iv) various interface boards that are used in specific signal processing tasks, comprising, for example, analog and digital input and output boards, communication interface boards, and motor controller boards. The interface boards, may for example, process a signal from a process monitor and provide a data signal to the CPU. The computer also has support circuitry that includes for example, co-processors, clock circuits, cache, power supplies and other well-known components that are in communication with the CPU. RAM 66 can be used to store the software implementation of the present invention during process implementation. The instruction sets of code of the present invention are typically stored in storage mediums and recalled for temporary storage in RAM when being executed by the CPU. The user interface between an operator and the controller can be, for example, via a display 68 and a data input device 70, such as a keyboard or light pen. To select a particular screen or function, the operator enters the selection using the data input device and can reviews the selection on the display.

The processor 52 also comprises computer program code 80 that is readable by the computer and may be stored in the memory, for example on the non-removable storage medium or on the removable storage medium. The computer program code 80 comprises one or more software programs and/or sets of instructions of program code to transform the circuit design pattern to flashes, assign the flashes to scans, and operate the particle beam column 54 and its components to scan a particle beam across a substrate 150. The computer program code 80 may be written in any conventional programming language, such as for example, assembly language, C++, Pascal, or Fortran. Suitable program code is entered into a single file, or multiple files, using a conventional text editor and stored or embodied in computer-usable medium of the memory. If the entered code text is in a high level language, the code is compiled, and the resultant compiler code is then linked with an object code of pre-compiled library routines. To execute the linked, compiled object code, the user invokes the object code, causing the CPU to read and execute the code to perform the tasks identified in the program.

The flash data generated by the processor 52, which includes flash shape and size constraints, is processed for writing on the substrate by a suitable writing method. The processor 52 arranges the flashes in a selected order constrained by the type of scanning system used, for example, raster, vector or hybrid raster-vector scanning. In raster microvector (RMV) shaped beam scanning, a particle beam with a controlled flash shape is flashed at different locations across a substrate by a vector minor field scan superimposed on a raster major field scan. In this method, each vector field is assigned at most one flash and the vector flash fields are overlapped along raster scans which are offset by set distances to locally average over variations in pattern density. After assigning the flashes in a selected order corresponding to raster scan locations, a dose is assigned to each flash. The flash dose is the dwell time that the particle beam is maintained turned on over a vector determined location along a raster major field scan. Thus, the final flash data includes flash shape, location and dose.

Figure 6A:
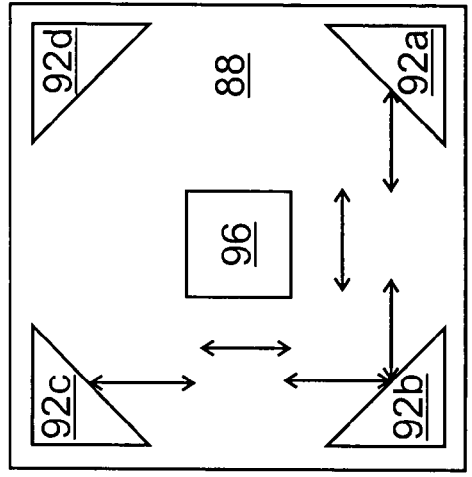
FIGS. 6A and 6B are schematic diagrams of upper and lower aperture plates that can be used to shape a particle beam into rectangles and right isosceles triangles using a deflector.
Figure 6B:
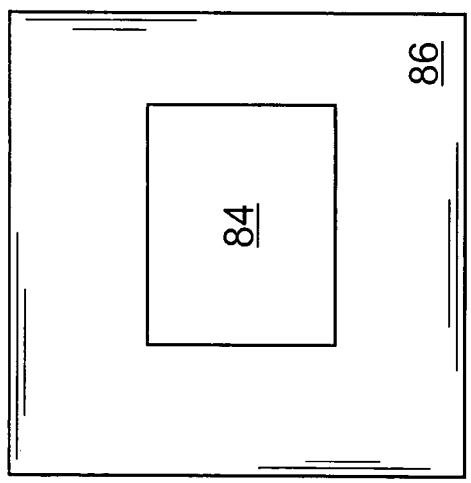
Figure 7:
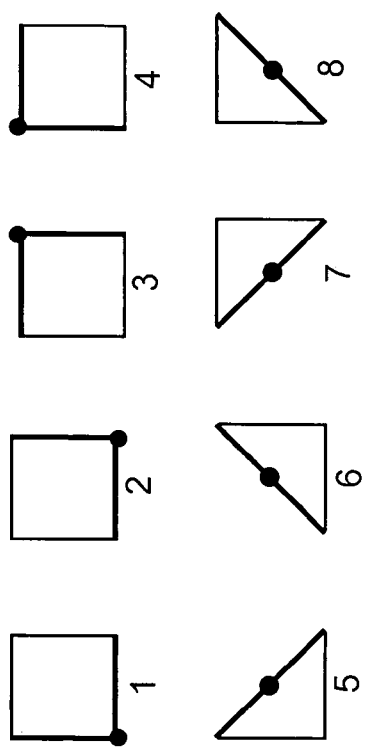
FIG. 7 is a schematic diagram showing the different flash shapes that can be obtained from the apertures of FIGS. 6A and 6B, and also showing the edges of the lower aperture superimposed on the flash shapes.

In the particle beam apparatus 50, the deflector 25 is used to deflect the particle beam 26 to shape flashes by imaging, for example, a square upper aperture 84 of a upper aperture plate 86 (FIG. 6A) onto a lower aperture plate 88 that contains a square lower aperture 90 surrounded by four right triangle lower apertures 92a–d (FIG. 6B). The aperture plates 86, 88 form beam flash shapes such as a rectangle, with sides parallel to the X/Y axes by projecting the image of the upper square aperture 84 against one of the corners of the lower square aperture 90, so two adjacent edges are formed by the lower aperture. FIG. 7 shows the 8 flash shapes produced by these apertures including four different types of rectangles 1–4 that can be formed with the four corners, and right-angle triangles 5–8 which have their non-hypotenuse sides parallel to the X/Y axes and their hypotenuse formed by the lower aperture. The heavy lines show the edges of these shapes, formed by the apertures 90, 92a–d of the lower aperture plate 88. The circular dots are reference points, which represent locations that are fixed relative to the center of the lower aperture plate 88. A selected shape type and size is formed by imaging the square upper aperture 84 in the right location over the lower aperture plate 88 and placing the flash in the proper location relative to the raster location in the scan by microvectoring.

The flash areas of the rectangular and triangular tiles are constrained by the parameters of the particle beam apparatus, for example, a maximum singular dimension of a tile should be less than $\frac{3}{2}\lambda$ and the minimum dimension at least about $\frac{1}{2}\lambda$, where $\lambda$ is a fixed length for the particle beam apparatus 50 which is related to the maximum flash area and the separation between raster locations. For a particle beam apparatus 50 that is an electron beam column having a maximum flash area of 192 nm and a separation distance between raster locations in the X-direction of about 1024 nm, the value of $\lambda$ is about 128 nm. In FIG. 6B, each arrow represents a length of $1.5\lambda$, where $\lambda$ is defined as a number slightly greater than $\lambda$, for example, greater than $\lambda$ by about 10%.

During scanning, the particle beam is modulated by blanking the beam while moving a substrate upon which the particle beam is incident. Scanning is performed by writing a series of passes, with each pass consisting of a series of Y-oriented scans. A multiphase writing strategy is typically used with the choice of 4-phase or 2-phase scans. In 4-phase writing, successive passes are stepped up in the Y-axis direction by roughly ¼ of the scan length for that each area is exposed to a total of four times. In 2-phase writing, successive passes are stepped up in the Y-axis direction by roughly ½ of the scan length so that each area is exposed twice.

Figure 8:
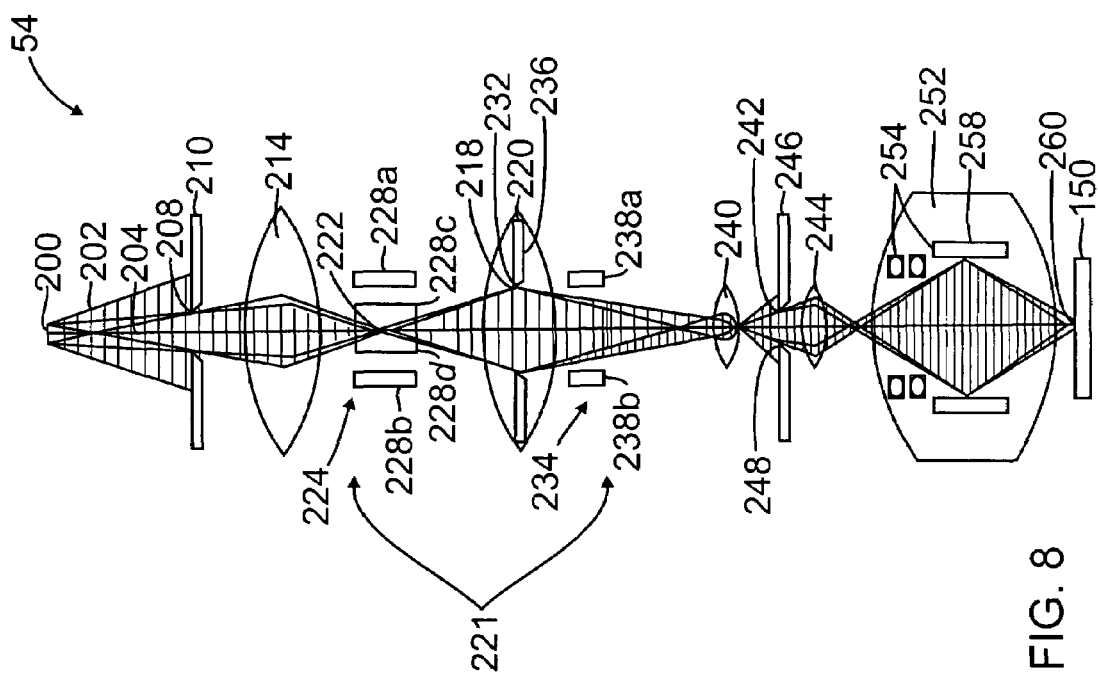
FIG. 8 is a schematic diagram of an exemplary particle beam column that is an electron beam column.

An exemplary version of a particle beam column 54 for generating, shaping, and raster microvector scanning an electron beam across a substrate 150 is shown in FIG. 8. The column 54, which in this example is an electron beam column, comprises an electron source 200, which directs an electron beam 202 along an axis 204 toward the substrate 150. The electron source 200 can be a thermal field emission (TFE) electron source, for example, a TFE source that provides a current per unit solid angle, $dI/d\Omega$, otherwise known as angular intensity, of at least 1 mA/steradian. The electron source 200 outputs the electron beam 202 from approximately 420 mm above the surface of the substrate 150. While a thermal field emission source is described it should be noted that other electron sources are also available, for example, lanthanum hexaboride.

The electron beam 202 is shaped into a variable rectangular spot by first passing the beam through an upper aperture 208 formed in upper aperture plate 210. Condenser lens 214 which may be an electromagnetic lens focuses an image of upper aperture 208 in the plane of the lower aperture plate 220 which contains the square lower aperture 218 and other apertures. The upper aperture plate 210 may have the same or a different configuration than the exemplary upper aperture plate 86 (FIG. 6A) and the lower aperture plate 220 may also have the same or a different configuration than the lower aperture plate 88 (FIG. 6B). The condenser lens 214 also focuses the image 222 of source 200 at a point along the axis 204 and in the center of a first deflector 224. The focal length of lens 214 is determined primarily to focus the aperture image 232 in the plane of lower aperture 218.

The electron beam column comprises a plurality of deflectors including a first deflector 224 and a second deflector 234. The first deflector 224 comprises four electrostatic plates, with two plates 228a,b perpendicular to the plane of the paper (as shown), and two additional plates 228c,d parallel to the plane as shown by the dotted lines. The focused image 222 of the electron source 200 should be at the virtual center of the deflector 224 provided by electrostatic plates 228a–d. Each pair of plates 228a,b and 228c,d serve to deflect the electron beam 202 laterally along two orthogonal directions. The deflector 224 deflects the focused image 232 of the first square upper aperture 208 with respect to second square lower aperture 228 to shape the electron beam to form the desired flash shape.

Condenser lens 236 is a magnetic lens within which the second aperture 218 of the lower aperture plate 220 is disposed. Condenser lens 236 images the source image 222 into the entrance pupil of the first demagnification lens 240.

When two voltage differentials are applied between the electrostatic plate pairs 228a,b and 228c,d, respectively, the image 232 of the upper aperture is deflected with respect to the lower square aperture 228, however, the source image 222 is not deflected and remains stationary because it is at the center of deflection. Consequently, irrespective of the deflection of aperture image 232 in the X or Y direction, focused source image 222 remains stationary, and the image of source image 222 projected by condenser lens 236 into the entrance pupil of first demagnification lens 240 will remain constant in position.

The composite image, which is identical with the lower square aperture 228, is demagnified in two steps through first demagnification lens 240 and second demagnification lens 244. Simultaneously, first demagnification lens 240 simultaneously creates a magnified image of the source in the plane of circular hole plate 246. This image of the source is, of course, dependent on the position of source image 222. Since source image 222 remains stationary irrespective of the deflection in forming the composite aperture image, focused image 248 of the source remains centered about the axis 204 at circular hole plate 246. Thus, substantially uniform current density is provided by circular hole plate 246 which admits only the central or axial portion of the Gaussian source being traced and minimizes aberrations generated in the final lens.

Projection lens 252 generates the electron beam spot 260 by projecting the image of the aperture 208 in the upper aperture plate 210, which is then demagnified in two steps by the demagnification lenses 240 and 244 to form the beam spot on the target substrate 150. While the image of aperture 208 is being thus demagnified, the first demagnification lens 240 simultaneously creates a magnified image of the electron beam source 200 in the plane of circular hole 242 of the circular hole plate 246 centered about the electron beam column axis. The second demagnification lens 244 images the circular hole 242 at the center 254 of the projection lens 252 and defines the semi-angle of convergence. Thus, uniform beam current density is provided since circular hole 242 admits only the central or axial portion of the source beam trace, which minimizes aberrations. For a given round aperture size, the second demagnification lens determines the final beam convergence angle and consequently the required brightness. The final or projection lens provides the required working distance deflection yoke 258 in order that the beam may be deflected over the target field to be exposed. During the writing of patterns by an electron beam, the intensity of the beam spot 60 is modulated by electrostatic deflectors 228 and 238.

In addition, since the image of the source projected upon the entrance pupil of demagnification lens 240 is centered about the axis irrespective of the deflection, only the central portions of the lenses in the demagnification system and of the projection lens will be primarily utilized. Thus, degradation of beam spot edge resolution which would result if the source image projected upon demagnification and projection lenses were off center is avoided. It should be noted that this latter effect is significant in systems, which do not utilize the circular hole 242.

Figure 9:
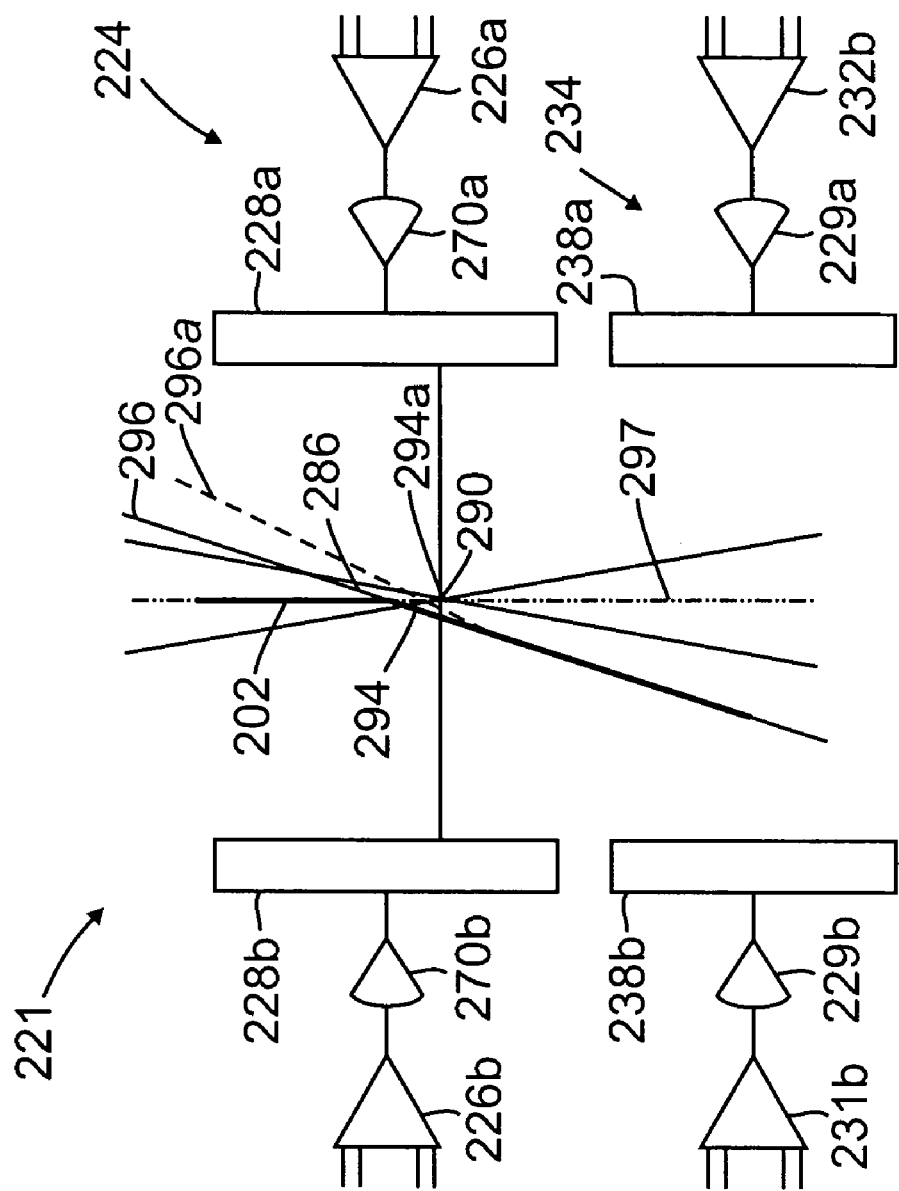
FIG. 9 shows operation of the electrostatic plates of the deflectors of the electron beam column of FIG. 8 as they deflect the electron beam across the lower aperture to shape the beam.

FIG. 9 shows operation of a deflector system 221 comprising a first deflector 224a and second deflector 234. In the first deflector 224, a voltage differential is applied between a pair of electrostatic plates 228a, b to provide a push-pull circuit in which the voltage level of plate 228a is negative relative to the voltage applied to plate 228b or vice versa. Similarly, in the second deflector 234, the voltage differential applied to the electrostatic plates 238a, b provide a push-pull circuit in which the voltage level of plate 238a is negative relative to the voltage applied to plate 238b or vice versa. Operation of the other plates 228c,d of the first deflector 224 and operation of the plates 238a–d of the second deflector 234 is substantially the same.

In operation, the voltage differential across plates 228a,b of the first deflector 224 is generated by applying a corrected first and second bit codes to a pair of DACs 226a,b, each of which converts its bit code to complimentary analog voltage signals which is then amplified by the amplifiers 270a,b and applied to the deflector plates 228a, 288b, respectively. The voltage level and relative polarity of the signal applied to the two plates 228a,b determine the extent of deflection of the electron beam 202. The second deflector 234 comprises the plates 238a,b which are each connected to the outputs of amplifiers 229a,b which in turn amplify an analog voltage signal from the DACs 231a,b. The second deflector 234 is positioned downstream from the first deflector 224. The voltage drop applied between plates 238a,b of the second deflector 234 may be less than the voltage drop across the plates 234a and 234b, to further refine the deflection accuracy.

Initially, a first differential voltage is applied between the deflector plates 228a,b of the first deflector 224, and a second differential voltage is applied to the deflector plates 238a of the second deflector 234, for example, half-way between the voltage levels of plates 228a,b. The path of the upper aperture image diagrammatically represented by line 282 will be deflected as shown. Also, as the beam trace 286 of the source image indicates, the source image will be focused at point 290. The virtual center of deflection 294 of the apparatus is determined by the intercept of the extension 296 of the beam path as deflected and axis 297, which was the original path of beam 282 before deflection.

To move the center of deflection to coincide with the focused beam at 290, the apparatus is adjusted. Since the center of deflection 294 produced by voltage drop between primary plates 228a,b is above focused image 290 of the source, the center of deflection 294 is moved down by applying a potential difference between auxiliary plates 238a,b in the same sense as the potential difference between plates 228a,b, that is, if plate 228a has a positive voltage with respect to plate 228b, then plate 238b is made positive with respect to plate 238a. This shifts the path 282 of the aperture image so that extension 296 moves to the position of dashed line 296a and crosses axis 297 as shown to produce a virtual center of deflection 294a in coincidence with focus source image 290. Conversely, if it is desired to move the center of deflection 294 upward, the reverse actions are performed to produce a voltage drop between plates 238a and 238b which is in the opposite sense to the voltage drop between the plates 234a and 234b. This opposes the deflection action of the plates 234a,b to move the center of deflection upward.

The voltage drop which may be applied between plates 238a and 238b may be in the order of about ten to fifty percent of the voltage drop across the plates 234a and 234b, e.g., when the voltage swing between the plates 234a,b is in the order of about twenty volts, the voltage swing between the plates 238a,b would be in the order of about two to twenty volts.

Furthermore, while the instant description is toward moving the center of deflection to deflect the aperture image in one lateral direction, similar orthogonally postioned deflector plates 234c,d and 238c,d (as shown in FIG. 8) can be used in connection to deflect the beam in the other lateral direction. Also, although electrostatic deflection apparatus has been disclosed for the preferred embodiment as the means for deflecting the image of the upper aperture and for moving the center of deflection, it will be clear that other deflection apparatus such as magnetic deflection apparatus may be used for the same purpose.

In another version of the particle beam column 54, one or more sets of cascaded deflectors are used to shape, size, and deflect the particle beam to increase pattern writing resolution. A single set of cascaded deflectors is used for the same function, for example, the set of deflectors can be fed bit codes that are determined using a single lookup table. The lookup table contains information for supplying bit codes to each set of plates of each deflector. The different sets of cascaded deflectors can provide separate functions, for example, a first set of cascaded deflectors can be used to shape or size the electron beam and a second set used to accurately deflect and position the beam on the substrate, or for other functions. When operated in combination, a set of two cascaded deflectors of (2M−1) states each have a combined effect on the particle beam of 2*(2M−1)−1=4M−3 states. This extends the original N-bit resolution of each DAC to N+2 bits which is desirable.

Figure 10:
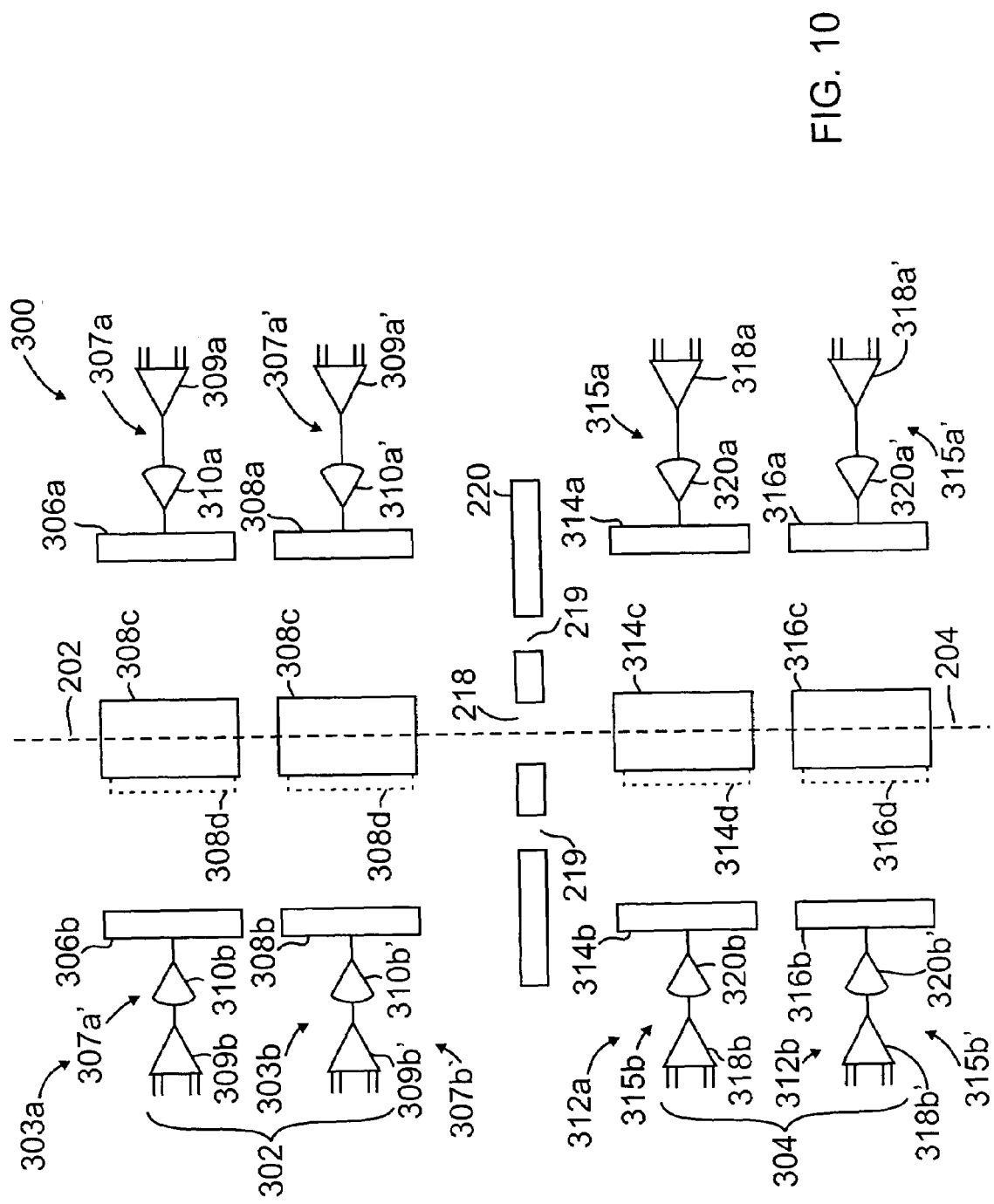
FIG. 10 is a schematic diagram of a deflector system comprising a plurality of sets of cascaded deflectors in which each set of cascaded deflectors performs different functions.

An exemplary embodiment of a multifunction deflector system 300 comprising a plurality of sets of cascaded deflectors, including a first cascaded deflector set 302 and a second cascaded deflector set 304, is illustrated in FIG. 10. The first deflector set 302 comprises two separate deflectors 303a, b that are stacked one below the other. Each of the deflectors 303a,b is substantially the same, i.e., comprises four orthogonal deflector plates 306a–d and 308a–d, respectively, which are similarly sized, and positioned at 90° to each other around a square which extends about the location of the particle beam 202 such that pairs of deflector plates, such as for example the plates 306a,b oppose one another across a particle beam gap. The first set of cascaded deflectors 302 operates to accurately shape and size the flash produced by the electron beam 202 by positioning the beam 202 on the square lower apertures 218 or the triangular apertures 219 of the lower aperture plate 220.

Each deflector plate 306a–d and 308a–d, of the first cascaded deflector set 302 is separately powered by a separate voltage driver 307 comprising a DAC 309 and amplifier 310, of which only the voltage drivers 707a,b,a',b' comprising the DACs 309a,b,a',b' and amplifiers 310a,b,a', b', respectively, are shown in the diagram for simplicity. The cascaded deflector set 302 is operated with a single lookup table which contains bit code values for all eight plates of the two deflectors 303a,b. As before, digital electronics receive an input digital code that expresses the voltages to be applied to each of the deflector plates 306a–d and 308a–d, and substitutes the input digital code with an output digital code such that when the input digital code is determined to provide a linear output response voltage from a DAC, the output digital code is maintained the same as the input digital code. However, when the input digital code is determined to provide a non-linear output response voltage from a DAC, the output digital code is substituted with a different digital code that provides a linear response from the DAC while providing the same differential voltage between a pair of opposing deflector plates. In one version, the digital electronics looks up a first lookup table to determine if the input digital code is associated with a substitute digital code that is a different digital code, where the substitute digital code is a digital code that bypasses the non-linear response region of the DAC while still maintaining the same differential voltage between a pair of opposing deflector plates. The cascaded deflector set 302 provides better resolution because each deflector 303a,b provides (2M−1) states so that the cascaded deflector set 302 provides 2*(2M−1)−1=4M−3 states, thereby extending the resolution of each DAC 309 from their original N-bit resolution to N+2 bits.

The second cascaded deflector set 304 of the multifunction deflector system 300 provides microvector displacement of the shaped electron beam 202 across the substrate 150. The second deflector set 304 also comprises two separate deflectors 312a, b stacked over each other. Each deflector 312a,b comprises four orthogonal deflector plates 314a–d and 316a–d, respectively, which are similarly sized, and also positioned at right angles to each other about a square. Each deflector plate 314a–d and 316a–d, is separately powered by a separate voltage driver 315 comprising a DAC 318 and amplifier 320, of which only the voltage driver 315a,b,a',b' comprising the DACs 318a,b,a',b' and amplifiers 320a,b,a',b', respectively, are shown in the diagram for simplicity. The cascaded deflector set 304 is operated with a second lookup table, which is a different table than the first lookup table, and which contains bit code values for all eight plates of the two deflectors 312a,b, to further increase the accuracy of positioning the electron beam 202.

The dual cascaded deflector system 300 uses a total of 4 pairs of deflector plates per axis to achieve 14 bit resolution for each function, while using 12 bit DACs. The dual cascaded deflector system 300 can also be positioned at other different positions on the particle beam column 54 as would be apparent to one of ordinary skill in the art; thus, the scope of the present invention should not be limited to the exemplary embodiments of deflector arrangements illustrated herein. For example, the dual cascaded deflector system 300 can be positioned entirely downstream of the lower aperture 220. In this version, the deflector system 300 serves to position the flash with improved resolution beyond that possible with conventional DAC arrangements. Yet another deflector system comprises positioning the dual cascaded deflector system 300 entirely upstream of the lower aperture 220. In this version, the deflector system 300 serves to shape the flash with improved resolution beyond that possible with conventional DAC arrangements.

Although the present invention has been described in considerable detail with regard to certain preferred versions thereof, other versions are possible. For example, the deflector can be used with other particle beam apparatuses or in other positions or configurations within a particle or electron beam column as would be apparent to one of ordinary skill in the art. Also, multiple cascaded deflectors comprising three, four or even more pairs of deflectors can be used to further refine the deflection accuracy or beam shape and size. Thus, the appended claims should not be limited to the description of the preferred versions contained herein.

What is claimed is:

1. An electrostatic deflector for a particle beam apparatus, the electrostatic deflector comprising:
  (a) first and second deflector plates that face one another across a particle beam gap, the deflector plates being electrostatically chargeable;
  (b) a first voltage driver comprising a first DAC to convert a first digital code to a first analog voltage signal, and a first amplifier to amplify the first analog voltage signal to generate a first voltage to be applied to the first deflector plate;
  (c) a second voltage driver comprising a second DAC to convert a second digital code to a second analog voltage signal, and a second amplifier to amplify the second analog voltage signal to generate a second voltage to be applied to the second deflector plate, the second voltage being substantially complementary to the first voltage to maintain a selected differential voltage between the first and second deflector plates; and
  (d) digital electronics to receive an input digital code that expresses the first and second voltages to be applied to the first and second deflector plates, and substitute the input digital code with an output digital code such that:
    (i) when the input digital code is determined to provide a linear output response voltage from the first or second DAC, the output digital code is maintained the same as the input digital code; and
    (ii) when the input digital code is determined to provide a non-linear output response voltage from the first or second DAC, the output digital code is substituted with a substitute digital code that provides a linear response from the first or second DAC while providing the same differential voltage between the first and second deflector plates.

2. A deflector according to claim 1 wherein the digital electronics looks up a lookup table to determine if the input digital code is associated with a substitute digital code that is a different digital code, where the substitute digital code is a digital code that bypasses the non-linear response region of the first or second DAC while still maintaining the same differential voltage between the first and second deflector plates.

3. A deflector according to claim 1 wherein the output digital code comprises a first output bit code for the first DAC and a second output bit code for the second DAC.

4. A deflector according to claim 3 wherein the first and second output bits codes express first and second voltages that are substantially complementary.

5. A deflector according to claim 1 wherein the input digital code comprises a first input bit code that expresses the first voltage and a second input bit code that expresses the second voltage.

6. A deflector according to claim 1 wherein the substitute digital code is selected to avoid a segment boundary of digital codes applied to the first or second DAC.

7. A deflector according to claim 1 further comprising:
  (e) third and fourth deflector plates that face one another across a particle beam gap, the third and fourth deflector plates being electrostatically chargeable and positioned orthogonal to the first and second deflector plates;
  (f) a third voltage driver comprising a third DAC to convert a third digital code to a third analog voltage signal, and a third amplifier to amplify the third analog voltage signal to generate a third voltage to be applied to the third deflector plate;
  (g) a fourth voltage driver comprising a fourth DAC to convert a first digital code to a fourth analog voltage signal, and a fourth amplifier to amplify the fourth analog voltage signal to generate a fourth voltage to be applied to the fourth deflector plate, the fourth voltage being complementary to the third voltage to maintain another selected differential voltage between the third and fourth deflector plates; and
  wherein the digital electronics receives another input digital code that expresses the third and fourth voltages to be applied to the third and fourth deflector plates, and substitutes the input digital code with an output digital code such that:
    (i) when the input digital code is determined to provide a linear output response voltage from the third or fourth DAC, the output digital code is maintained the same as the input digital code; and
    (ii) when the input digital code is determined to provide a non-linear output response voltage from the third or fourth DAC, the output digital code is substituted with a different digital code that provides a linear response from the third or fourth DAC while providing the same differential voltage between the first and second deflector plates.

8. An electrostatic deflector for a particle beam apparatus, the electrostatic deflector comprising:
(a) first and second deflector plates that face one another across a particle beam gap, the deflector plates being electrostatically chargeable;
(b) a first voltage driver to provide a first voltage to the first deflector plate, the first voltage driver comprising a first DAC to convert a first digital code to a first analog voltage signal which is passed to a first amplifier to generate a first voltage to be applied to the first deflector plate; and
(c) a second voltage driver to provide a second voltage to the second deflector plate that is complementary to the first voltage, the second voltage driver comprising a second DAC to convert a second digital code to a second analog voltage signal which is passed to a second amplifier to generate a second voltage to be applied to the second deflector plate; and
(d) digital electronics to receive an input digital code that expresses the first and second voltages to be applied to the first and second deflector plates, and when the input digital code is determined to provide a non-linear output response voltage from the first or second DAC, substitute the input digital code with an output digital code that provides a linear response from the first or second DAC while providing the same differential voltage between the first and second deflector plates.

9. An electrostatic deflector for a particle beam apparatus, the electrostatic deflector comprising:
(a) first and second deflector plates that face one another across a particle beam gap, the deflector plates being electrostatically chargeable;
(b) a first voltage driver comprising a first DAC capable of converting a first digital code to a first analog voltage signal which is passed to a first amplifier to generate a first voltage to be applied to the first deflector plate; and
(c) a second voltage driver comprising a second DAC to convert a second digital code to a second analog voltage signal which is passed to a second amplifier to generate a second voltage to be applied to the second deflector plate, the second voltage being complementary to the first voltage; and
(d) digital electronics to (i) receive an input digital code that expresses the first and second voltages to be applied to the first and second deflector plates, (ii) determine if the input digital code is listed in a lookup table and associated with a substitute input digital code which bypasses any non-linear output response voltage of the first or second DAC, (iii) generate an output digital code which is either the input digital code or the substitute digital code, (iv) look up a translation table that associates each output digital code with a first bit code for the first DAC and a second bit code for the second DAC, and (v) pass the first bit code to the first DAC and the second bit code to the second DAC.

10. A deflector according to claim 9 wherein the first and second bits codes express first and second voltages that are substantially complementary.

11. A deflector according to claim 9 wherein the substitute digital code is selected to avoid a segment boundary of the digital codes applied to the first or second DAC.

12. A cascaded electrostatic deflector for a particle beam apparatus, the cascaded electrostatic deflector comprising:
(a) an upper deflector comprising:
(i) a pair of opposing upper deflector plates that are electrostatically chargeable and face one another across a particle beam gap;
(ii) a first upper voltage driver comprising a first DAC to convert a first digital code to a first analog voltage signal, and a first amplifier to amplify the first output analog voltage signal to generate a first voltage to be applied to the one of the deflector plates; and
(iii) a second upper voltage driver comprising a second DAC to convert a second digital code to a second analog voltage signal, and a second amplifier to amplify the second analog voltage signal to generate a second voltage to be applied to the other upper deflector plate, the second voltage being substantially complementary to the first voltage to maintain a selected differential voltage between the deflector plates;
(b) a lower deflector comprising:
(i) a pair of opposing lower deflector plates that are electrostatically chargeable and face one another across a particle beam gap;
(ii) a first lower voltage driver comprising a first DAC to convert a first digital code to a first analog voltage signal, and a first amplifier to amplify the first output analog voltage signal to generate a first voltage to be applied to a lower deflector plate; and
(iii) a second lower voltage driver comprising a second DAC to convert a second digital code to a second analog voltage signal, and a second amplifier to amplify the second analog voltage signal to generate a second voltage to be applied to the other lower deflector plate, the second voltage being substantially complementary to the first voltage to maintain a selected differential voltage between the deflector plates; and
(c) digital electronics to receive an input digital code that expresses the voltages to be applied to each upper and lower deflector plate, and substitute the input digital code with an output digital code such that:
(i) when the input digital code is determined to provide a linear output response voltage from a DAC, the output digital code is maintained the same as the input digital code; and
(ii) when the input digital code is determined to provide a non-linear output response voltage from the DAC, the output digital code is substituted with a different digital code that provides a linear response from the DAC while providing the same differential voltage between a pair of opposing upper or lower deflector plates.

13. A cascaded deflector according to claim 12 wherein the digital electronics looks up a lookup table to determine if the input digital code is associated with a substitute digital code that is a different digital code, where the substitute digital code is a digital code that bypasses the non-linear response region of the DAC while still maintaining the same differential voltage between a pair of opposing deflector plates.

14. A cascaded deflector according to claim 13 wherein in each of the upper and lower deflectors, the output digital code comprises a first output bit code for the first DAC and a second output bit code for the second DAC.

15. A cascaded deflector according to claim 14 wherein the first and second output bits codes express first and second voltages that are substantially complementary.

16. A deflector according to claim 14 the input digital code comprises a first input bit code that expresses the first voltage and a second input bit code that expresses the second voltage.

17. A deflector according to claim 12 wherein the substitute digital code is selected to avoid a segment boundary of digital codes applied to a DAC.

18. A multifunction deflector system comprising a plurality of sets of cascaded deflectors, the multifunction deflector system comprising:
(a) a first cascaded deflector set comprising first and second deflectors that are stacked one below the other, the first and second deflectors comprising pairs of opposing deflector plates that are each powered by a separate voltage driver comprising a DAC;
(b) a second cascaded deflector set comprising third and fourth deflectors that are stacked one below the other; the third and fourth deflectors comprising pairs of opposing deflector plates that are each powered by a separate voltage driver comprising a DAC; and
(c) digital electronics to receive an input digital code that expresses the voltages to be applied to each of the deflector plates, and substitute the input digital code with an output digital code such that:
  (i) when the input digital code is determined to provide a linear output response voltage from a DAC of a voltage driver, the output digital code is maintained the same as the input digital code, and
  (ii) when the input digital code is determined to provide a non-linear output response voltage from a DAC, the output digital code is substituted with a different digital code that provides a linear response from a DAC of the voltage driver while providing the same differential voltage between a pair of opposing deflector plates.

19. A multifunction deflector system according to claim 18 wherein each deflector comprises four orthogonal deflector plates, each deflector plate being powered by a voltage driver.

20. A multifunction deflector system according to claim 18 wherein the deflector plates are similarly sized and positioned at 90° to each other around a square which extends about the location of a particle beam passing through the deflector.

21. A multifunction deflector system according to claim 18 wherein the first cascaded deflector set operates to accurately shape and size a flash produced by an electron beam.

22. A multifunction deflector system according to claim 21 wherein the second cascaded deflector set provides microvector displacement of the shaped electron beam flash across a substrate.

23. A multifunction deflector system according to claim 18 wherein each deflector provides (2M−1) states and wherein each cascaded deflector provides $2*(2M-1)-1=4M-3$ states.

24. A multifunction deflector system according to claim 18 wherein each DAC comprises an N-bit resolution and wherein N-bit resolution DACS are extended to provide resolutions of N+2 bits in the cascaded deflectors.

* * * * *